US008370273B2

(12) United States Patent
Hung et al.

(10) Patent No.: US 8,370,273 B2
(45) Date of Patent: Feb. 5, 2013

(54) METHOD AND APPARATUS FOR CONSTRUCTING A CANONICAL REPRESENTATION

(75) Inventors: Ngai Ngai William Hung, San Jose, CA (US); Dhiraj Goswami, Wilsonville, OR (US); Jasvinder Singh, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 831 days.

(21) Appl. No.: 12/361,318

(22) Filed: Jan. 28, 2009

(65) Prior Publication Data

US 2010/0191679 A1    Jul. 29, 2010

(51) Int. Cl.
G06F 15/18    (2006.01)
(52) U.S. Cl. .......................... 706/12; 716/122
(58) Field of Classification Search ............ 706/12; 716/122
See application file for complete search history.

(56) References Cited

U.S. PATENT DOCUMENTS

| 7,346,862 | B2 * | 3/2008 | Zhuang ............ 716/102 |
| 7,885,907 | B1 * | 2/2011 | Yen et al. ............ 706/45 |
| 2003/0154003 | A1 | 8/2003 | Eker |
| 2005/0005251 | A1 | 1/2005 | Moondanos |
| 2006/0047680 | A1 * | 3/2006 | Paruthi et al. ........ 707/102 |
| 2006/0112119 | A1 | 5/2006 | Vian |
| 2007/0044084 | A1 | 2/2007 | Wang |

* cited by examiner

Primary Examiner — Kakali Chaki
Assistant Examiner — Mai T Tran
(74) Attorney, Agent, or Firm — Park, Vaughan, Fleming & Dowler LLP; Laxman Sahasrabuddhe

(57) ABSTRACT

Some embodiments provide systems and techniques to facilitate construction of a canonical representation (CR) which represents a logical combination of a set of logical functions. During operation, the system can receive a CR-size limit. Next, the system can construct a set of CRs based on the set of logical functions, wherein each CR in the set of CRs represents a logical function in the set of logical functions. The system can then combine a subset of the set of CRs to obtain a combined CR. Next, the system can identify a problematic CR which when combined with the combined CR causes the CR-size limit to be exceeded. The system can then report the problematic CR and/or a logical function associated with the problematic CR to a user, thereby helping the user to identify an error in the set of logical functions.

20 Claims, 7 Drawing Sheets $$C(a,b,c) = \bar{a} \cdot b \cdot c + a \cdot \bar{b} \cdot c + a \cdot b \cdot \bar{c}$$

$$302 \begin{cases} C_1 : \overline{x_1} + x_2 \\ C_2 : x_2 + x_3 \\ C_3 : x_1 + \overline{x_2} + x_3 \end{cases} \implies$$

$$K_1 = C_1 \quad 304$$

$$\Downarrow$$

$$K_2 = C_1 \cdot C_2 \quad 306$$

$$\Downarrow$$

$$K_3 = C_1 \cdot C_2 \cdot C_3 \quad 308$$

FIG. 3

METHOD AND APPARATUS FOR CONSTRUCTING A CANONICAL REPRESENTATION

BACKGROUND

1. Field

This disclosure generally relates to electronic design automation. More specifically, the disclosure relates to methods and apparatuses for constructing a canonical representation, e.g., a binary decision diagram.

2. Related Art

Rapid advances in computing devices have been made possible by advances in design and verification tools. Indeed, without such tools it would have been almost impossible to design and verify complicated integrated circuits which are commonly found in today's computing devices.

Constrained random simulation methodologies have become increasingly popular for functional verification of complex designs, as an alternative to directed-test based simulation. In a constrained random simulation methodology, random vectors are generated to satisfy certain operating constraints of the design. These constraints are usually specified as part of a test-bench program. A test-bench automation tool (TBA) uses the test-bench program to generate random solutions for a set of random variables, such that a set of constraints over the set of random variables are satisfied. These random solutions can then be used to generate valid random stimulus for the Design Under Verification (DUV). This stimulus is simulated using simulation tools, and the results of the simulation are typically examined within the test-bench program to monitor functional coverage, thereby providing a measure of confidence on the verification quality and completeness.

Constraint solvers are typically used to generate random vectors that satisfy the set of constraints. The basic functionality of a constraint solver is to solve the following constraint satisfaction problem: given a set of variables and a set of constraints, find a set of values for the set of variables that satisfy the set of constraints. For better software maintenance and quality, these solutions generated by the constraint solver need to be reproducible and deterministic. Further, since users typically require good coverage for the random simulation, the constraint solutions also need to be uniformly distributed.

Unfortunately, the constraint satisfaction problem is NP-complete. Logic simulation, on the other hand, usually scales linearly with the size of the design. As a result, the speed of stimulus generation usually lags far behind the speed at which the stimulus is used in the simulation. Hence, it is desirable to improve performance of a constraint solver because it can significantly improve the overall performance of constrained random simulation tools.

SUMMARY

Some embodiments of the present invention provide systems and techniques to facilitate construction of a canonical representation (CR) of a logical function which can be expressed as a combination of a set of logical functions.

During operation, the system can receive a CR-size limit. Next, the system can construct a set of CRs based on the set of logical functions, wherein each CR in the set of CRs represents a logical function in the set of logical functions. While constructing the set of CRs, if the system detects that a CR has exceeded the CR-size limit, the system can report the CR and/or the logical function associated with the CR to the user.

Once at least some of the CRs are successfully built, the system may try to combine the CRs. In some embodiments, the system may combine the CRs in an iterative fashion. Specifically, the system may heuristically order the CRs to obtain a CR function ordering (which is fundamentally different from a variable ordering), and iteratively combine the CRs according to the CR function ordering. While combining the CRs, the system may determine that some CRs cannot be combined without exceeding the CR-size limit. Specifically, the system may successfully combine a subset of CRs to obtain an intermediate CR. However, the system may determine that the CR-size limit is violated whenever the system tries to combine any of the remaining CRs with the intermediate CR. In response to determining that some CRs cannot be combined without exceeding the CR-size limit, the system may report the CRs to the user. The user may use this information to quickly identify errors in the constraints.

In some embodiments, once the system determines that some CRs cannot be combined without exceeding the CR-size limit, the system may automatically increase the CR-size limit and try to combine the CRs with the increased CR-size limit.

BRIEF DESCRIPTION OF THE FIGURES

FIG. 3 illustrates how a BDD can be constructed from a set of constraints in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
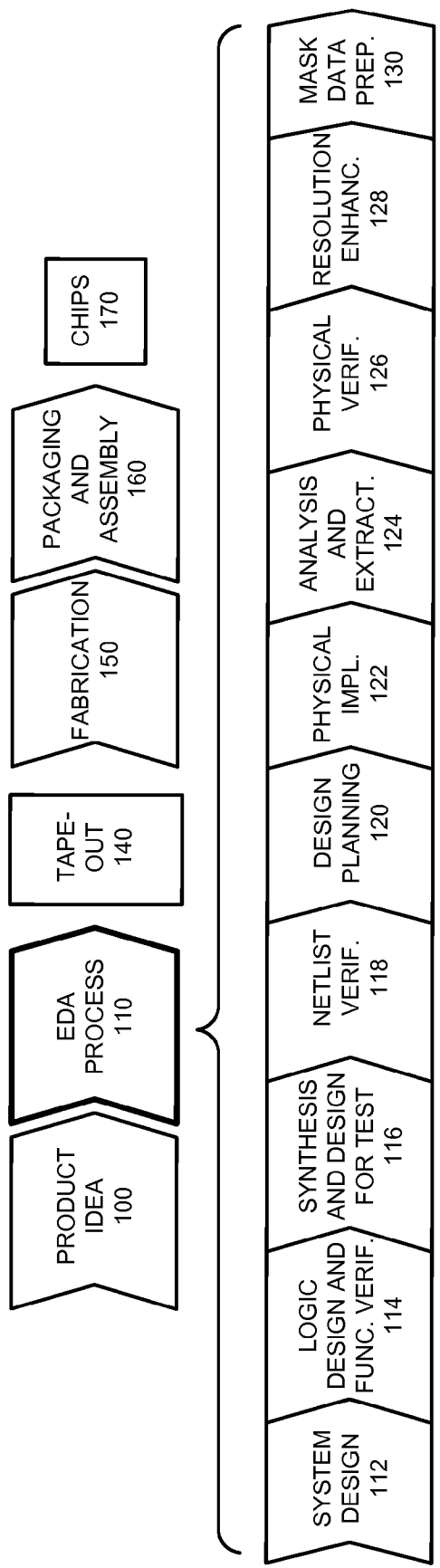
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA (Electronic Design Automation) process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces the correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Some embodiments can be used during one or more of the above-described steps. Specifically, some embodiments can be used during functional verification (step 114).

Constrained Random Simulation

Correctly defining the environment under which a given DUV is supposed to work is an important prerequisite for effective design verification. Traditionally, verification engineers have used a test-bench to model the environment of the DUV. The test-bench can be described using a hardware description language. Note that the test-bench typically includes a set of tests which constrain the environment in an appropriate way so as to cover a targeted set of behaviors of the DUV.

Some hardware languages, such as SystemVerilog, support several advanced constructs for specifying constraints explicitly in a test-bench. Specifically, explicit constraints can be used to restrict the random choices of the test-bench in a way that is consistent with its protocol with the DUV. Such test-benches are typically called constrained random test-benches.

As mentioned above, the performance of random stimulus generation usually lags far behind the performance of logic simulation. Because of this, improving the performance of a constraint solver can have a substantial impact on the overall performance of the test-bench. Hence, it is desirable to improve performance of a constraint solver.

BDD (Binary Decision Diagram)

In a typical constrained random simulation scenario, users write a set of constraints (e.g., using SystemVerilog), and during simulation, the constraint solver will try to find a random simulation stimulus (a set of random variable assignments) that satisfies the user-specified constraints. Constraint solvers can use BDD, ATPG (Automatic Test Pattern Generation), satisfiability, or other similar methods to find the satisfiable solution (simulation stimulus).

Specifically, in a BDD-based constraint solver, the system typically uses BDDs to represent the constraints. The random variables (used for simulation) are treated as BDD variables, and the conjunction of the constraints (on these variables) is constructed as a Boolean function represented by the BDD. An assignment to these variables would satisfy the constraints if and only if the evaluation of the Boolean function using the assigned values would result in a "TRUE" value.

Figures 2A, 2B:
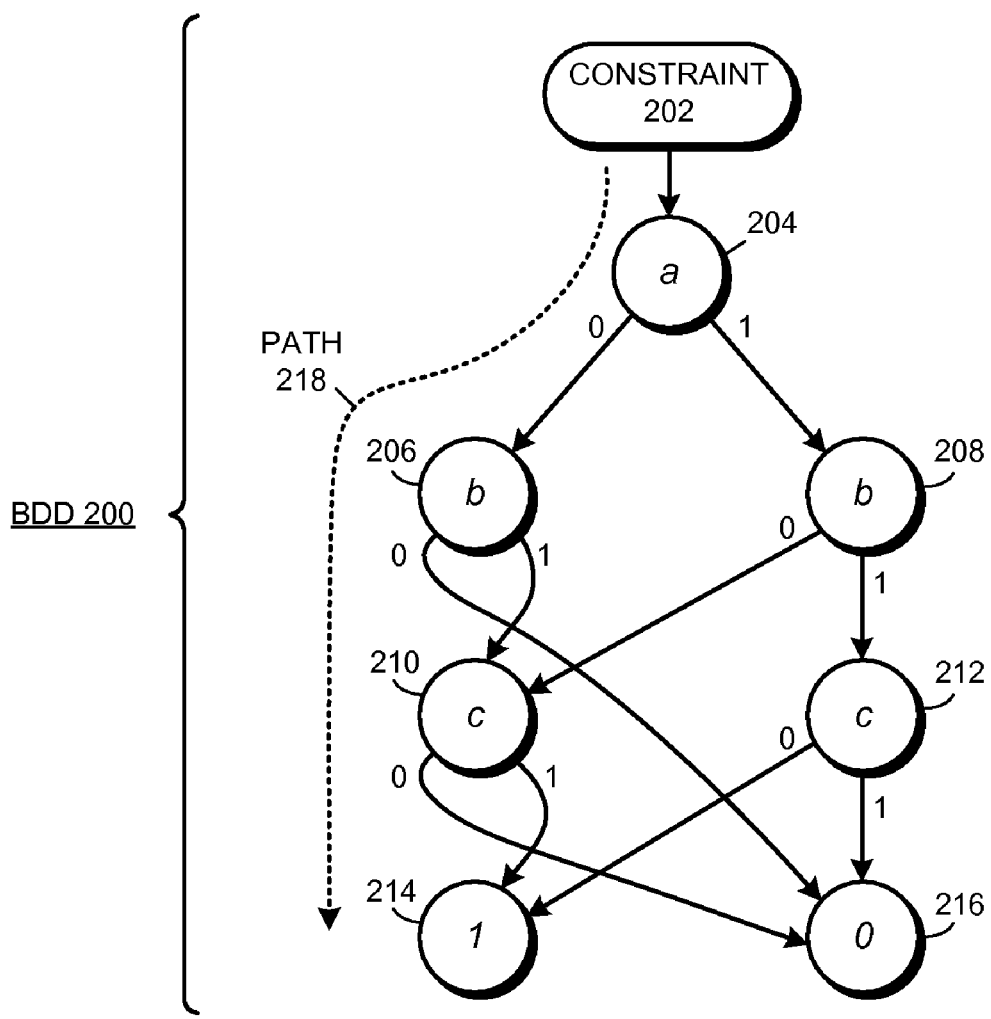
FIG. 2A illustrates a constraint in accordance with an embodiment of the present invention.
FIG. 2B illustrates a BDD (Binary Decision Diagram) in accordance with an embodiment of the present invention.

FIG. 2A illustrates a constraint in accordance with an embodiment of the present invention.

The constraint illustrated in FIG. 2A is a Boolean function over three random variables: "a," "b," and "c." The random variables are typically used to model the DUV, e.g., the random variable "a" may represent the logic state of an input signal in the DUV. Note that, of all the possible value assignments to the random variables, only some value assignments correspond to valid states of the DUV. Since the intent in constrained-random simulation is to verify the DUV over valid states, a technique is needed to restrict the values of the random variables. Constrained-random simulation typically uses a set of constraints to restrict the values of the random variables. Specifically, during constraint-based simulation, the test-bench can generate random inputs (e.g., value assignments for random variables "a," "b," and "c") which satisfy the set of constraints. In this manner, by using a set of constraints, the simulation and verification tool can verify the DUV by providing it a stimulus that is expected to occur during normal operation.

One approach for generating random inputs is to use a BDD. Specifically, the system can first generate a BDD that represents the set of constraints. Next, the system can use the BDD to generate random inputs. Specifically, each path in the BDD from the root node to the terminal node that corresponds to the value "1" can be associated with a value assignment that satisfies the set of constraints.

FIG. 2B illustrates a BDD in accordance with an embodiment of the present invention.

BDD 200 can represent the constraint shown in FIG. 2A. BDD 200 includes nodes 202, 204, 206, 208, 210, 212, 214, and 216. Node 202 can be the root node which can be used to represent the entire constraint. Node 204 can be associated with the variable "a," nodes 206 and 208 can be associated with variable "b," and nodes 210 and 212 can be associated with variable "c." Node 214 can represent the Boolean value "TRUE" or "1" for the Boolean function. In other words, node 214 can represent a situation in which the constraint has been satisfied. In contrast, node 216 can represent the Boolean value "FALSE" or "0." In other words, node 216 can represent a situation in which the constraint has not been satisfied.

The directed edges in BDD 200 can represent a value assignment to a random variable. For example, the directed edge between nodes 204 and 206 can be associated with assigning value "0" to the random variable "a." Similarly, the directed edge between nodes 208 and 212 can be associated with assigning value "1" to the random variable "b."

A directed path in a BDD from the root node, e.g., node 202, to the terminal node for the Boolean value "TRUE," e.g., node 214, can correspond to a value assignment to the random variables that satisfies the set of constraints which is being represented by the BDD, e.g., the constraint shown in FIG. 2A. For example, path 218 begins at node 202 and terminates at node 214. The value assignments associated with path 218 are: a=0, b=1, and c=1. It will be evident that this value assignment causes the Boolean function shown in FIG. 2A to evaluate to "TRUE."

Once the system builds the BDD, it can generate constrained random stimuli by determining all distinct paths from the root node to the terminal node that corresponds to the "TRUE" value, and by randomly selecting a path from the set of all distinct paths.

FIG. 3 illustrates how a BDD can be constructed from a set of constraints in accordance with an embodiment of the present invention.

Suppose a constrained random simulation needs to generate random inputs that satisfy set of constraints 302. A constraint solver can build a BDD for each constraint, i.e., one BDD each for constraints $C_1$, $C_2$, and $C_3$. Next, the solver can represent the conjunction of the set of constraints by using a BDD which is constructed by combining the individual BDDs.

In some embodiments, the solver can combine the BDDs in an iterative fashion. For example, in step 304, the solver can start with a BDD for constraint $K_1$ which is the same as constraint $C_1$. Next, in step 306, the solver can construct a BDD for constraint $K_2$ which is equal to the conjunction of constraints $C_1$ and $C_2$. Note that the BDD for constraint $K_2$ can be constructed by combining the BDDs for $K_1$ and $C_2$. Finally, in step 308, the solver can construct a BDD for $K_3$ which is equal to the conjunction of constraints $C_1$, $C_2$, and $C_3$. Note that the BDD for constraint $K_3$ can be constructed by combining the BDDs for $K_2$ and $C_3$. Further, note that the BDD for $K_3$ is a BDD for set of constraints 302. The BDD for $K_3$ can be used to generate random inputs that satisfy set of constraints 302. Further details on how to build and combine BDDs can be found in Jun Yuan et al., *Constraint-Based Verification*, Springer, January 2006.

Note that, it is possible for users to write a set of constraints that is very difficult to solve using a BDD-based constraint solver. Specifically, when a BDD-based constraint solver tries to generate a BDD for the set of constrains, the BDD can "blow up," e.g., the size of the BDD can become so large that it becomes impractical to construct the BDD or to use the BDD to generate solutions for the set of constraints. Note that the blow up problem is not limited to BDD-based approaches. For example, if the constraint solver uses an ATPG (automatic test pattern generation)-based approach, the user may feel that the constraint solver is taking forever to generate a solution.

The BDD blow up problem is one of the main performance problems in constraint-based random simulation. In other words, one of the reasons random stimulus generation lags behind logic simulation is because of the BDD blow up problem. If the system can help the user identify and fix situations in which the BDD is expected to blow up, the system can drastically improve the overall performance of the constraint solver. Specifically, the user would typically like to know why the constraints are causing the BDD to blow up, and more importantly, how to fix the problem or how to work around the problem. Often, the blow up is caused by a few constraints. In some situations, a constraint on its own can cause the BDD to blow up, while in other situations, the BDD blow up occurs due to the interaction between multiple constraints. If the system can identify the constraints that are causing the BDD to blow up, it can help a user to identify the error in the constraints, and also help the user to determine how to re-write the constraints to fix the BDD blow up problem. Once the user has re-written the constraints to avoid the blow up problem, the constraints can then be used by the constraint solver to generate the random input.

Note that constrained-random verification is just one of many applications that use BDDs. Hence, the above-described BDD blow up problem is not limited to the constrained-random verification application; the BDD blow up problem can occur in any application that combines BDDs to obtain a combined BDD. It follows, then, that a technique or system that facilitates the construction of a BDD by helping to solve the BDD blow up problem can be used in any application that combines BDDs.

Further, the blow up problem is not limited to BDDs. Specifically, the blow up problem can occur with any canonical representation of a logical function. Specifically, the system may construct CRs based on a set of logical functions. The blow up problem can occur when the system tries to combine the individual CRs to obtain a combined CR.

Note that a canonical representation of a logical function can generally be any representation which satisfies the following property: if two logical functions are equivalent, their canonical representations will be the same as long as the same variable ordering (or an equivalent characteristic) is used while constructing the canonical representation. Examples of canonical representations include, but are not limited to, binary decision diagrams, binary moment diagrams, zero-suppressed binary decision diagrams, multi-valued decision diagrams, multiple-terminal binary decision diagrams, algebraic decision diagrams, etc.

The following sections describe how a BDD can be constructed from a set of constraints and how a CR can be constructed from a set of logical functions.

Constructing a BDD From a Set of Constraints

Some embodiments of the present invention provide a system that can help a user to identify why a set of constraints is causing the resulting BDD to blow up. Specifically, the system can setup an arbitrary limit L on the runtime and/or memory usage (including the BDD size) for the constraint solver. While building the BDD, if the solver exceeds this limit, the system can conclude that the BDD has blown up.

As explained above, in a constrained random simulation scenario, we are given a set of constraints $K=\{c_1, c_2, \ldots, c_n\}$, where each $c_i$ is a constraint. To generate the random input, the constraint solver typically builds a BDD for each constraint and then combines the BDDs to obtain a combined BDD which represents the conjunction of the individual BDDs. The assignments of BDD variables that cause the conjunction result to evaluate to 1 or "TRUE" would constitute the solutions to the constraints. During the process of building the BDD for each constraint, if the BDD blows up (exceeds the BDD limit, memory limit, or runtime limit), then the system can conclude that this constraint is at least one of the reasons why the BDD construction process is taking so long. The system can report this constraint to the user, thereby helping the user identify the root cause of the BDD blow up problem.

Note that the BDD may blow up because of bad variable ordering (and even if we turn on dynamic variable ordering, it may still blow up due to conflicting ordering requirements in different constraints).

Note that variable ordering is fundamentally different from function ordering. Variable ordering refers to the order in which the variables are used to form the BDD. On the other hand, function ordering refers to the order in which the constraints (or logical functions) are combined. Note that changing the order in which the constraints (or logical functions) are combined does not change the variable ordering. Conversely, changing the order in which the variables are chosen when the BDD is constructed does not change the order in which the constraints are combined.

To help the user identify whether a particular variable ordering is causing the blow up, some embodiments can build a BDD for the problematic constraint using a second BDD manager which tries different variable orderings. If the BDD construction blows up even after the second BDD manager tries different variable orderings, the system can conclude that the problem lies in the constraint (e.g., the constraint may be too complicated to represent using a BDD), and not in the variable ordering. Accordingly, the system can report to the user that the problem lies in the constraint itself and not in the particular variable ordering. This can save the user from wasting time trying to solve the BDD blow up problem by changing the variable ordering. On the other hand, if changing the variable ordering fixes the blow up problem, the system can conclude that the BDD blow up problem was caused by conflicting BDD variable ordering requirements. The system can either print the constraints that caused the conflicting BDD variable ordering requirements or further narrow the constraints down before printing them.

Even if the BDD for each constraint does not blow up, the BDD may blow up when the BDDs are combined during the conjunction operation. As explained above, some embodiments can iteratively build conjunctions of $\{c_1, c_2, \ldots, c_n\}$, where the intermediate BDDs $J_1, J_2, \ldots, J_n$ are constructed as follows:

$$J_1 = c_1$$
$$J_2 = J_1 \cdot c_2$$
$$\vdots$$
$$J_i = J_{i-1} \cdot c_i$$
$$\vdots$$
$$J_n = J_{n-1} \cdot c_n$$

If all the above conjunctions can be constructed without a blow up, the entire set of constraints would have been solvable. However, when two BDDs are combined, the resulting BDD can become impracticably large. Note that if we perform the conjunction of the constraints $\{c_1, c_2, \ldots, c_n\}$ in a different order, the intermediate conjunction BDDs: $J_1, J_2, \ldots, J_{n-1}$, would be different, but the final conjunction result $J_n$ would be the same. It is possible that combining the BDDs in a particular order causes an intermediate BDD to blow up, but if the BDDs are combined in a different order, then none of the intermediate BDDs would blow up. Unfortunately, determining a BDD function ordering that does not cause a blow up is an NP-hard problem.

Some embodiments of the present invention detect if an intermediate BDD is expected to blow up and reorder the BDDs to try to avoid the blow up problem. Specifically, some embodiments utilize a greedy heuristic in which the constraints $\{c_1, c_2, \ldots, c_n\}$ are sorted in increasing BDD size. For example, the system can sort the constraints based on the number of nodes in the corresponding BDDs. It will be apparent to one skilled in the art that the constraints can be ordered using other approaches. For example, the system can sort the constraints based on the total amount of memory used for the associated BDDs. Further, the system can sort the constraints based on the number of constants and/or state variables in the constraint. Once the system sorts the BDDs in a particular order, the system can iteratively perform the conjunction operation as described above.

To illustrate how the system can reorder the constraints, suppose that the conjunction operation blows up when the system is trying to compute $J_i$. At this point the system can print a message to the user notifying the user that constraints $\{c_1, c_2, \ldots, c_{i-1}\}$ can all be solved together, but adding constraint $c_i$ to that causes the resulting BDD $J_i$ to exceed the capacity limit L. Note that notifying the user of exactly which constraint is causing the combining operation to blow up is already very useful for debugging the blow up problem. In some embodiments, the system can terminate the BDD construction process at this point. However, other embodiments can reorder the constraints and attempt to build the BDD using the new BDD function ordering.

In some embodiments, the system can select a constraint, $c_j$, from $\{c_{i+1}, c_{i+2}, \ldots, c_n\}$, and try to perform a conjunction between $J_{i-1}$ and $c_j$. If $c_j$ also causes a blow up, the system can select yet another constraint from the set of constraints that has not been used as yet. The conjunction process can continue in this manner until all constraints have been exhausted so that each of the remaining constraints would cause a blow up if combined with the intermediate BDD. Next, the system can report the set of constraints that were successfully "conjuncted," and the set of constraints that caused the blow up. For example, in the above scenario, if each one of the constraints $\{c_i, c_{i+1}, c_{i+2}, \ldots, c_n\}$ causes a blow up, the system can report to the user that it was able to successfully perform the conjunction operation with the constraints $\{c_1, c_2, \ldots, c_{i-1}\}$, and that each one of the remaining constraints $\{c_i, c_{i+1}, c_{i+2}, \ldots, c_n\}$ caused a blow up. This information can help the user to identify one or more errors in the constraints. Specifically, when the user reviews these two sets of constraints, the user may be able to identify a variable or an expression in the constraints that is causing the blow up.

For example, suppose a 16-bit multiplier in a circuit is causing the BDD blow up. When the user reviews the constraints that are causing the blow up, the user may immediately realize that the blow up is being caused by the 16-bit multiplier. For example, the user may note that all of the constraints that are causing the blow up are somehow related to the 16-bit multiplier, and hence, the user may correctly conclude that the blow up is being caused by the 16-bit multiplier. Note that a circuit will most likely include a large number of modules, and unless the system reports exactly which constraints caused the blow up, the user may end up wasting a large amount of time to identify the problem. Once the user identifies that the 16-bit multiplier is causing the blow-up, the user has many options to overcome the problem. For example, the user may re-write the constraints that are associated with the 16-bit multiplier, or the user may replace the 16-bit multiplier with a simpler module, e.g., an 8-bit multiplier.

As another illustrative example, suppose the circuit includes a floating-point module and an integer module, and suppose that both of these modules are not supposed to be turned on at the same time. When the user reviews the constraints that are causing the blow up, the user may realize that the constraints were incorrectly written because the constraints allow both the floating-point module and the integer module to be turned on at the same time. Once the user realizes this error, the user can re-write the constraints to fix the error.

Based on the above description, the following paragraphs describe systems and techniques that can be used to construct a BDD. Note that these systems and techniques are not limited to constrained-random verification and they are not constrained to conjunctions; they can be used in any application that involves combining BDDs.

Figure 4:
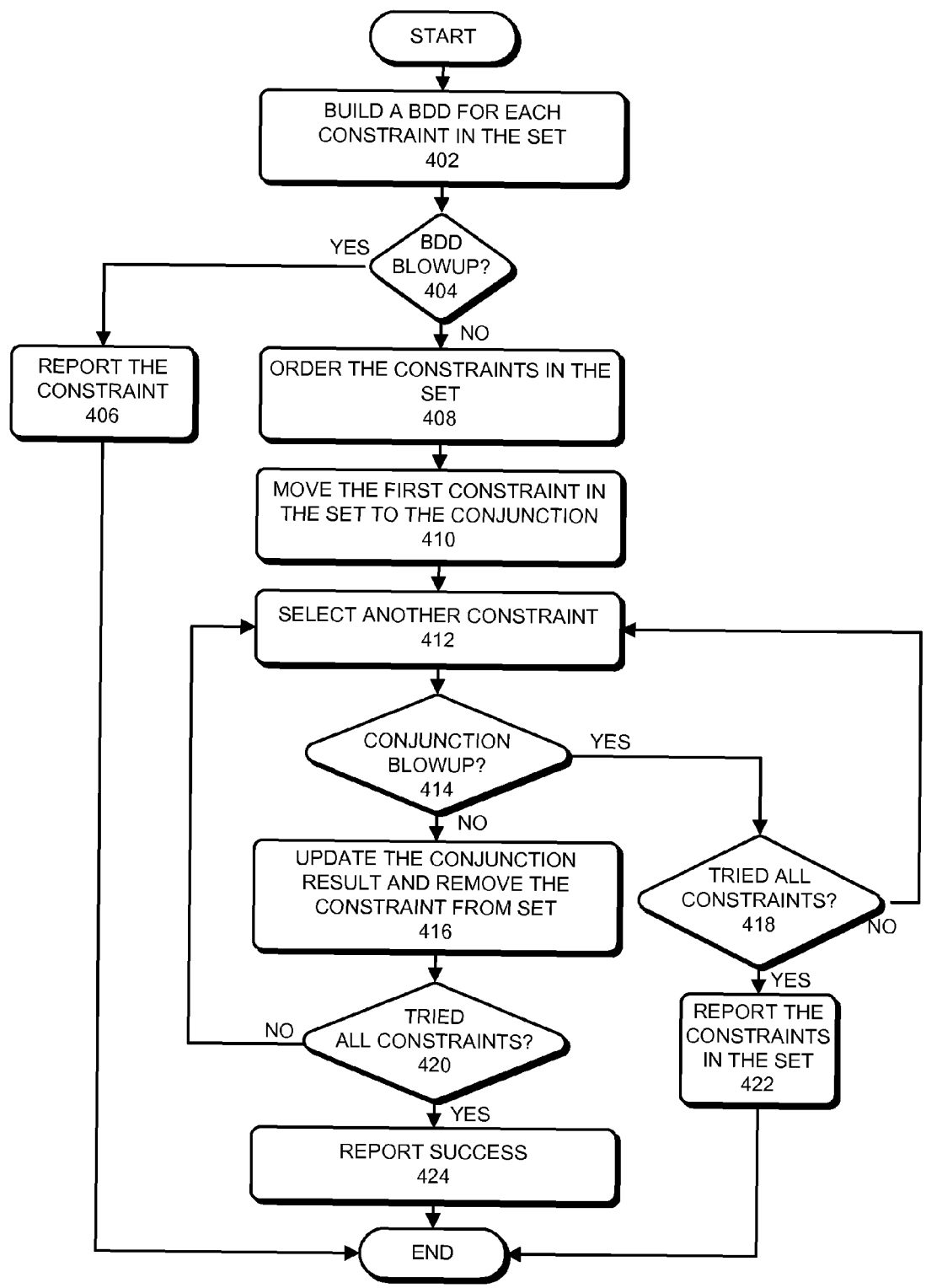
FIG. 4 presents a flowchart that illustrates a process for constructing a BDD in accordance with an embodiment of the present invention.

FIG. 4 presents a flowchart that illustrates a process for constructing a BDD in accordance with an embodiment of the present invention.

The process can begin by building a BDD for each constraint in the set (step 402). Next, the system can determine if any of the BDDs blew up while being constructed (step 404). If a BDD blew up, the system can report the associated constraint to the user (step 406). On the other hand, if no BDDs blew up, the system can then order the constraints in the set (step 408).

The system can then move the first constraint in the set to the conjunction (step 410). Next, the system can select another constraint from the set (step 412). The system can then determine if the resulting BDD is expected to blow up during the conjunction operation (step 414).

If the resulting BDD is blowing up, the system can then determine if it has tried all constraints (step 418). If the system has not tried all the constraints, the system can go back to step 412 and select another constraint in the set. On the other hand, if the system has tried all the constraints, the system can report the constraints in the set to the user (step 422) and terminate the process. Note that the constraints that are being reported to the user are those that were causing the conjunction process to blow up. In a variation, the system can increase the BDD-size limit and try to combine the BDDs by using the new BDD-size limit. The system may notify the user when it increases the BDD-size limit.

On the other hand, if the resulting BDD is not blowing up, the system can update the conjunction result and remove the selected constraint from the set (step 416). The system can then determine if all of the constraints have been tried (step 420). If so, the system can report that the conjunction operation was successful (step 424) and terminate the process. On the other hand, if not all constraints have been tried as yet, the system can go back to step 412 and select another constraint in the set.

Constructing a CR From a Set of Logical Functions

Note that the blow up problem is not limited to performing a conjunction operation for a set of BDDs. Specifically, the blow up problem can occur while combining a set of CRs that represent a set of logical functions.

Figure 5:
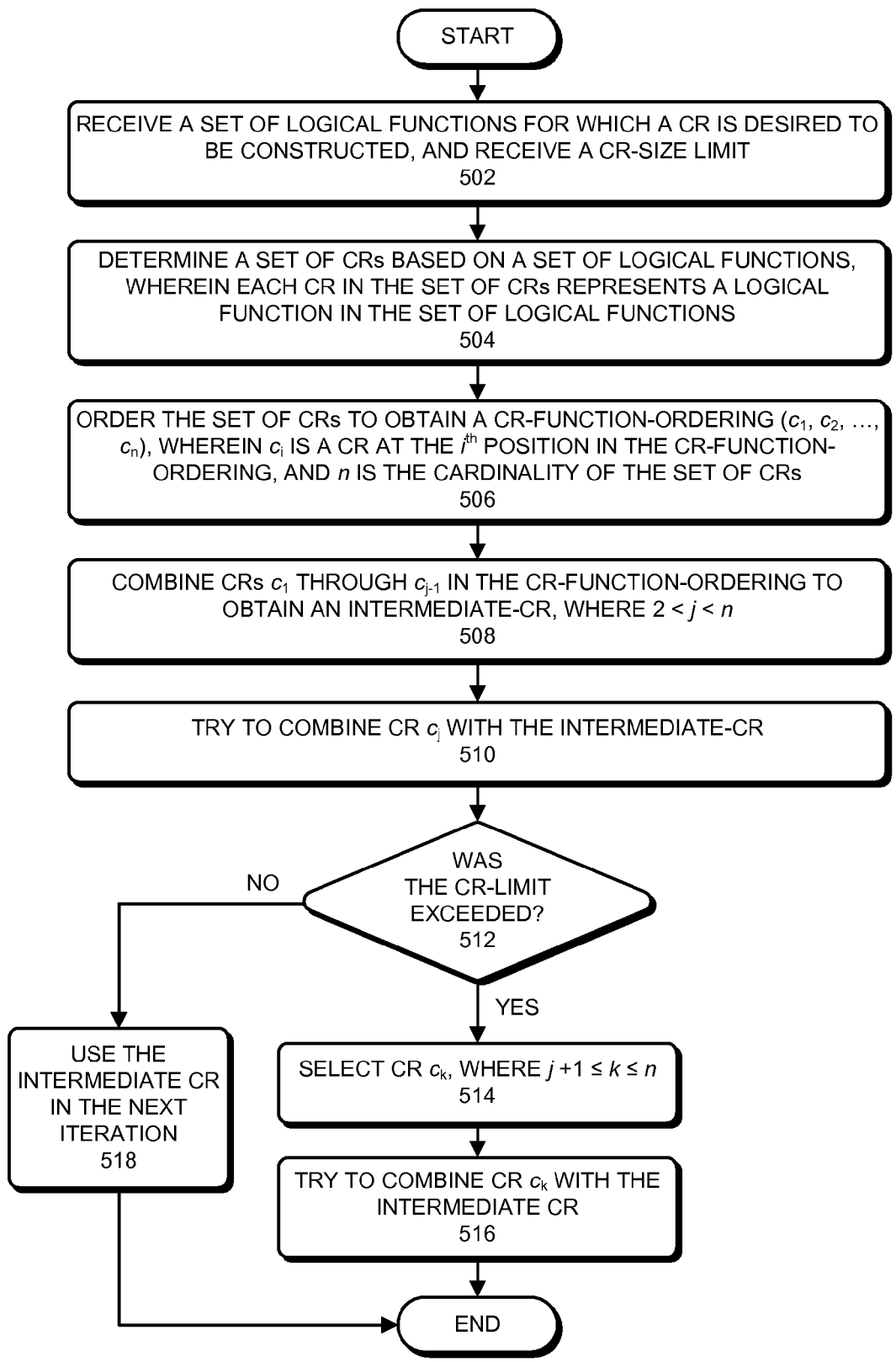
FIG. 5 presents a flowchart that illustrates a process for constructing a CR in accordance with an embodiment of the present invention.

FIG. 5 presents a flowchart that illustrates a process for constructing a CR in accordance with an embodiment of the present invention.

The process can begin by receiving a set of logical functions for which a CR is desired to be constructed (step 502).

The system can use a CR-size limit to determine when a CR has become too large. The CR-size limit can generally be based on one or more criteria which indicate whether constructing the CR is expected to cause performance problems.

For example, empirical evidence might suggest that, whenever the number of elements (e.g., nodes or edges) in a CR exceeds a particular threshold, it becomes highly likely that the CR construction process will require an impracticably long time. In such situations, the CR-size limit can be expressed in terms of the elements (e.g., nodes or edges) of the CR. Other criteria that can be used to express the CR-size limit include the amount of memory required to store the CR, and the number of processor cycles required to construct the CR.

In some embodiments, the system can express the CR-size in terms of multiple parameters or criteria. For example, the system may express the CR-size using two thresholds: a memory threshold and a processor-cycle threshold. In this example, a CR will exceed the CR-size if either the memory threshold is exceeded or the processor-cycle threshold is exceeded.

Continuing with the flowchart shown in FIG. 5, the system can then construct a set of CRs based on a set of logical functions, wherein each CR in the set of CRs represents a logical function in the set of logical functions (step 504). The system can monitor the size of the CRs while creating them from each constraint. If the size of a particular CR exceeds the CR-size limit, the system can report the CR to the user. In some embodiments, the system can terminate the process when the system determines that the size of a CR has exceeded the CR-size limit. In other embodiments, the system can continue building CRs for the other constraints.

Next, the system can order the set of CRs to obtain a CR-function-ordering $(c_1, c_2, \ldots, c_n)$, wherein $c_i$ is a CR at the $i^{th}$ position in the CR-function-ordering, and n is the cardinality of the set of CRs (step 506). Note that, variable ordering is fundamentally different from function ordering. Variable ordering refers to the order in which the variables of a specific logical function are chosen to form the CR (note that this applies to CRs that require variable ordering). On the other hand, function ordering refers to the order in which the logical functions are combined.

The system can then combine CRs $c_1$ through $c_{j-1}$ in the CR-function-ordering to obtain an intermediate CR, where $2 \leq j \leq n$ (step 508). Note that combining CRs results in a CR that represents a logical combination of the logical functions associated with the CRs. Hence, the intermediate CR represents the logical combination of the logical functions associated with CRs $c_1$ through $c_{j-1}$ in the CR-function-ordering. Two logical functions are said to be logically combined when a logical operation is used to create a logical expression that includes the two logical functions. For example, suppose a, b, c, and d are logical functions. Then, the following logical expression represents a logical combination of logical functions a, b, c, and d: $(a \cdot b \cdot c \cdot d)+(b \cdot \bar{c} \cdot \bar{d})$.

Next, the system can attempt to combine CR $c_j$ with the intermediate CR (step 510). The system can then determine whether the CR-size limit was exceeded or not (step 512).

If the CR-size limit was not exceeded, the system can use the intermediate CR in the next iteration (step 518). On the other hand, in response to determining that combining CR $c_j$ with the intermediate CR would result in a CR that exceeds the CR-size limit, the system can select CR $c_k$, where $j+1 \leq k \leq n$ (step 514). In some embodiments, the system can report CR $c_j$ and/or a logical function associated with CR $c_j$ to the user. The system can then attempt to combine CR $c_k$ with the intermediate CR (step 516). Further, in some embodiments, the system can automatically increase the CR-size limit in response to determining that attempts to combine the set of CRs have failed because the CR-size limit was exceeded during each attempt.

Figure 6:
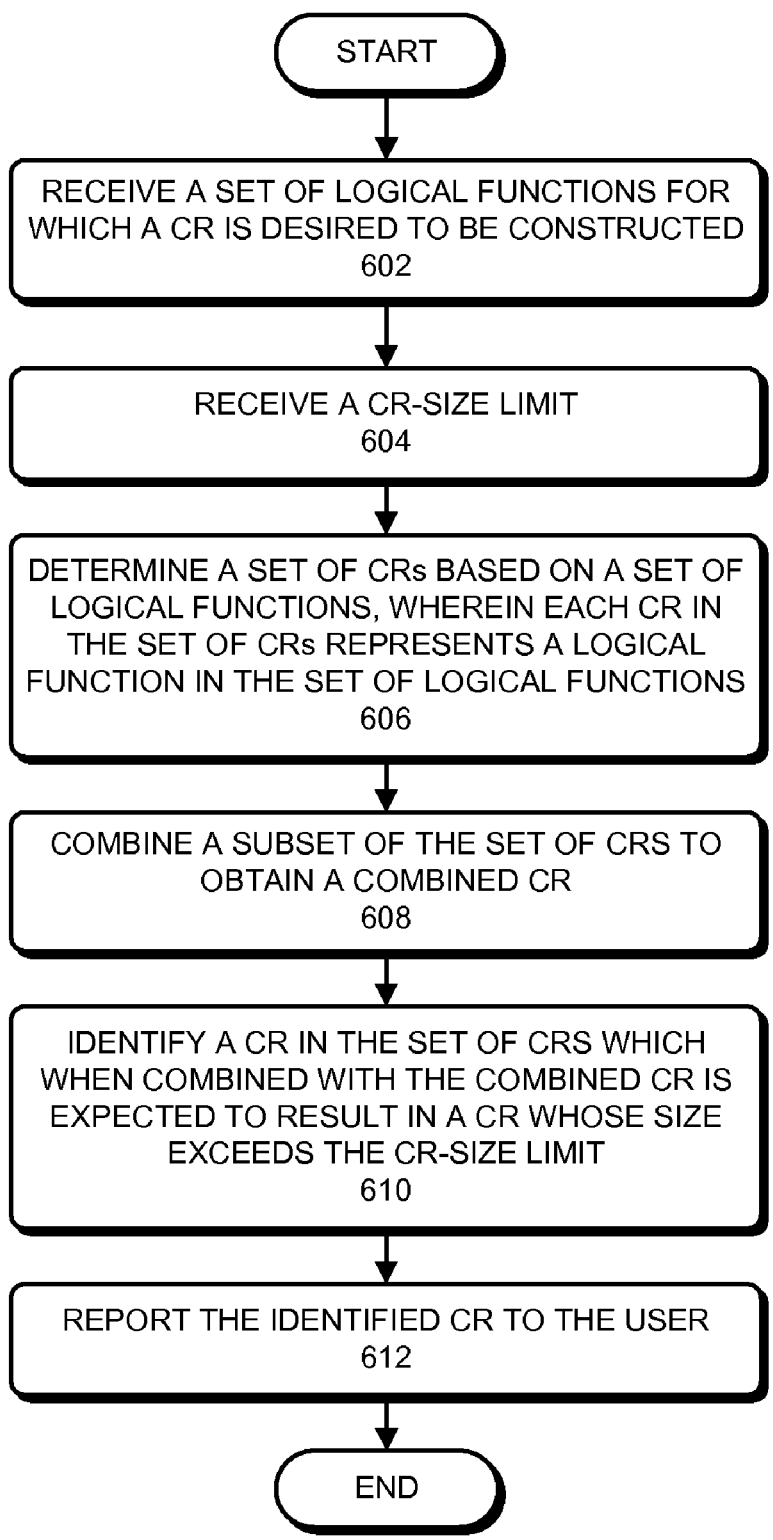
FIG. 6 presents a flowchart that illustrates a process for constructing a CR in accordance with an embodiment of the present invention.

FIG. 6 presents a flowchart that illustrates a process for constructing a CR in accordance with an embodiment of the present invention.

As before, the process can begin by receiving a set of logical functions for which a CR is desired to be constructed (step 602). Next, the system can receive a CR-size limit (step 604). The system can then construct a set of CRs based on a set of logical functions, wherein each CR in the set of CRs represents a logical function in the set of logical functions (step 606).

Next, the system can combine a subset of the set of CRs to obtain a combined CR (step 608). Note that the system can combine the CRs in any order. As described above, in some embodiments, the system can sort the CRs based on their size, and combine the CRs from the smallest to the largest. Regardless of how the CRs are ordered, the system would typically combine the CRs one at a time. Hence, at any given point during the combining process, the system would have combined a subset of the CRs. Note that combining CRs results in a CR that represents the logical combination of the logical functions associated with the CRs.

The system can then identify a CR in the set of CRs which when combined with the combined CR is expected to result in a CR whose size exceeds the CR-size limit (step 610). The system can then report the identified CR to the user (step 612). Specifically, the system can start to combine a CR with the combined CR to generate a resulting CR. Next, the system can monitor the resulting CR's size as the CR is being combined with the combined CR. If the system determines that the resulting CR's size has exceeded the CR-size limit, the system can stop combining the CR with the combined CR, and report the CR to the user.

Specifically, when the system selects a CR and tries to combine it with the combined CR, there are two possibilities. The first possibility is that the combining process completes without exceeding the CR-limit, and the resulting CR is a combination of the selected CR and the combined CR. The other possibility is that while combining the selected CR with the combined CR, the CR-size limit is exceeded. If that happens, the system can report the identified CR to the user, thereby helping the user to identify an error in the set of constraints.

Figure 7:
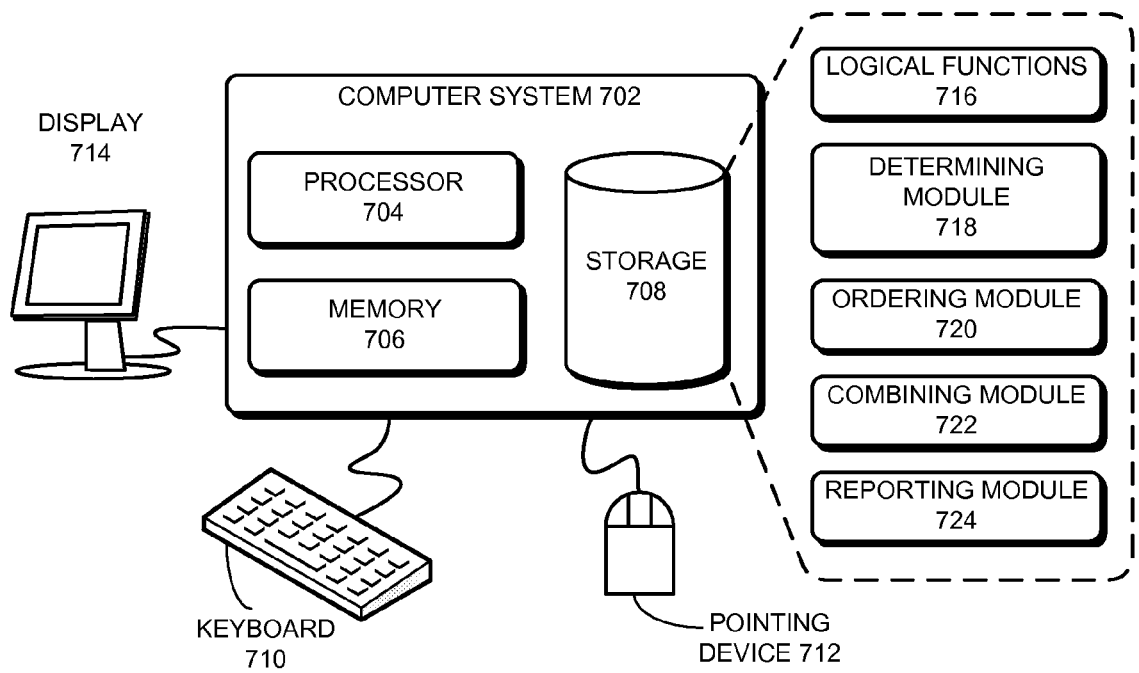
FIG. 7 illustrates a computer system in accordance with an embodiment of the present invention.

FIG. 7 illustrates a computer system in accordance with an embodiment of the present invention.

Computer system 702 comprises processor 704, memory 706, and storage 708. Computer system 702 can be coupled with display 714, keyboard 710, and pointing device 712. Storage 708 can store instructions and/or data that when processed by processor 704 cause computer system 702 to construct a CR. Specifically, storage 708 can store logical functions 716, constructing module 718, ordering module 720, combining module 722, and reporting module 724. During operation, computer system 702 can load instructions and/or data from storage 708 into memory 706 and process the instructions and/or data using processor 704.

Constructing module 718 can include instructions that when executed by processor 704 cause computer system 702 to construct CRs for logical functions 716. Ordering module 720 can include instructions that when executed by processor 704 cause computer system 702 to order the CRs that were constructed by constructing module 718. Combining module 722 can include instructions that when executed by processor 704 cause computer system 702 to combine the CRs according to a given order. Reporting module 724 can include instructions that when executed by processor 704 cause computer system 702 to report the CRs that the computer system was unable to combine. In some embodiments, the system can report the CRs using display 714.

Figure 8:
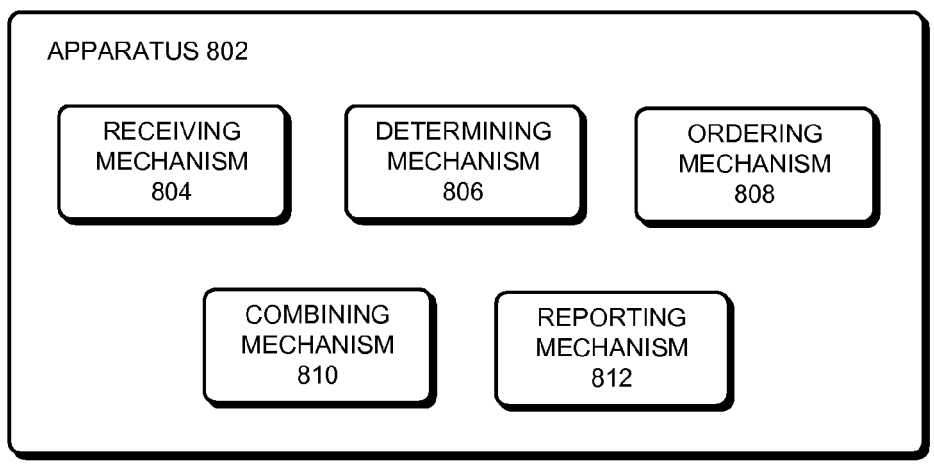
FIG. 8 illustrates an apparatus in accordance with an embodiment of the present invention.

FIG. 8 illustrates an apparatus in accordance with an embodiment of the present invention.

Apparatus 802 can comprise a number of mechanisms which may communicate with one another via a wired or wireless communication channel. Specifically, apparatus 802 can comprise receiving mechanism 804, constructing mechanism 806, ordering mechanism 808, combining mechanism 810, and reporting mechanism 812. In some embodiments, receiving mechanism 804 can be configured to receive a set of logical functions for which a CR is to be constructed, constructing mechanism 806 can be configured to construct CRs for the set of logical functions, ordering mechanism 808 can be configured to order the CRs to obtain a CR-function-ordering, combining mechanism 810 can be configured to combine the CRs according to the CR-function-ordering, and reporting mechanism 812 can be configured to report the CRs that apparatus 802 was unable to combine.

Apparatus 802 can be part of a computer system or be a separate device which is capable of communicating with other computer systems and/or devices. Apparatus 802 may be realized using one or more integrated circuits. Specifically, one or more mechanisms in apparatus 802 can be implemented as part of a processor.

CONCLUSION

The data structures and code described in this detailed description are typically stored on a computer-readable storage device, which may be any device that can store code and/or data for use by a computer system. The computer-readable storage device includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage device as described above. When a computer system reads and executes the code and/or data stored on the computer-readable storage device, the computer system performs the methods and processes embodied as data structures and code and stored within the computer-readable storage device.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-executed method to facilitate construction of a canonical representation (CR) which represents a logical combination of a set of logical functions, the method comprising:
   receiving a CR-size limit;
   constructing a set of CRs based on the set of logical functions, wherein each CR in the set of CRs represents a logical function in the set of logical functions;
   combining a subset of the set of CRs to obtain an intermediate CR;
   identifying a first CR in the remaining CRs which when combined with the intermediate CR is expected to result in a CR whose size exceeds the CR-size limit; and
   in response to identifying the first CR, reporting a first logical function associated with the first CR to a user.

2. The computer-executed method of claim 1, wherein combining the subset of the set of CRs includes:
   ordering the set of CRs to obtain a CR-function-ordering; and
   combining the subset of the set of CRs according to the CR-function-ordering.

3. The computer-executed method of claim 2, wherein ordering the set of CRs includes sorting the set of CRs based on size.

4. The computer-executed method of claim 1, wherein constructing the set of CRs includes reporting a second the user if the second CR's size is expected to exceed the CR-size limit.

5. The computer-executed method of claim 1, wherein identifying the first CR includes:
   start combining the first CR with the intermediate CR to generate a resulting CR;
   monitoring the resulting CR's size as the first CR is being combined with the intermediate CR; and
   stop combining the first CR with the intermediate CR in response to determining that the resulting CR's size has exceeded the CR-size limit.

6. The computer-executed method of claim 1, wherein a CR is a binary decision diagram (BDD).

7. A computer system, comprising:
   a processor; and
   a storage device storing instructions executable by the processor, the instructions comprising:
   instructions for receiving a CR-size limit;
   instructions for constructing a set of CRs based on the set of logical functions, wherein each CR in the set of CRs represents a logical function in the set of logical functions;
   instructions for combining a subset of the set of CRs to obtain an intermediate CR;
   instructions for identifying a first CR in the remaining CRs which when combined with the intermediate CR is expected to result in a CR whose size exceeds the CR-size limit; and
   instructions for, in response to identifying the first CR, reporting a first logical function associated with the first CR to a user.

8. The computer system of claim 7, wherein the instructions for combining the subset of the set of CRs includes:
   instructions for ordering the set of CRs to obtain a CR-function-ordering; and
   instructions for combining the subset of the set of CRs according to the CR-function-ordering.

9. The computer system of claim 8, wherein the instructions for ordering the set of CRs includes instructions for sorting the set of CRs based on size.

10. The computer system of claim 7, wherein the instructions for constructing the set of CRs includes instructions for reporting a second CR to the user if the second CR's size is expected to exceed the CR-size limit.

11. The computer system of claim 7, wherein the instructions for identifying the first CR includes:
   instructions to start combining the first CR with the intermediate CR to generate a resulting CR;
   instructions for monitoring the resulting CR's size as the first CR is being combined with the intermediate CR; and
   instructions to stop combining the first CR with the intermediate CR in response to determining that the resulting CR's size has exceeded the CR-size limit.

12. The computer system of claim 7, wherein a CR is a binary decision diagram (BDD).

13. A computer-executed method to construct a canonical representation (CR) which represents a logical combination of a set of logical functions, the method comprising:
   receiving a CR-size limit;
   constructing a set of CRs based on the set of logical functions, wherein each CR in the set of CRs represents a logical function in the set of logical functions;
   ordering the set of CRs to obtain a CR-function-ordering $\{c_1, c_2, \ldots, c_n\}$, wherein $c_i$, is a CR at the $i^{th}$ position in the CR-function-ordering, and n is the cardinality of the set of CRs;
   combining CRs $c_1$ through $c_{j-1}$ in the CR-function-ordering to obtain an intermediate-CR, wherein $2 < j \leq n$;
   in response to determining that combining CR $c_j$, with the intermediate-CR would result in a CR that exceeds the CR-size limit, selecting CR $c_k$, wherein $j+1 \leq k \leq n$; and
   attempting to combine CR $c_k$ with the intermediate-CR.

14. The computer-executed method of claim 13, wherein ordering the set of CRs includes sorting the set of CRs based on size.

15. The computer-executed method of claim 13, wherein a CR is a binary decision diagram (BDD).

16. The computer-executed method of claim 13, further comprising increasing the CR-size limit in response to determining that attempts to combine the set of CRs have failed because the CR-size limit was exceeded during each attempt.

17. A computer system, comprising:
   a processor; and
   a storage device storing instructions executable by the processor, the instructions comprising:
   instructions for receiving a CR-size limit;
   instructions for constructing a set of CRs based on the set of logical functions, wherein each CR in the set of CRs represents a logical function in the set of logical functions;

instructions for ordering the set of CRs to obtain a CR-function-ordering $\{c_1, c_2, \ldots, c_n\}$, wherein $c_i$ is a CR at the $i^{th}$ position in the CR-function-ordering, and n is the cardinality of the set of CRs;

instructions for combining CRs $c_1$ through $c_{j-1}$ in the CR-function-ordering to obtain an intermediate-CR, wherein $2<j<n$;

instructions for, in response to determining that combining CR $c_j$ with the intermediate-CR would result in a CR that exceeds the CR-size limit, selecting CR $c_k$, wherein $j+1 \leq k \leq n$; and instructions for attempting to combine CR $c_k$ with the intermediate-CR.

18. The computer system of claim 17, wherein the instructions for ordering the set of CRs includes instructions for sorting the set of CRs based on size.

19. The computer system of claim 17, wherein a CR is a binary decision diagram (BDD).

20. The computer system of claim 17, the instructions further comprising instructions for increasing the CR-size limit in response to determining that attempts to combine the set of CRs have failed because the CR-size limit was exceeded during each attempt.

* * * * *